United States Patent
Choi et al.

(10) Patent No.: US 9,634,272 B2
(45) Date of Patent: Apr. 25, 2017

(54) FOLDABLE DISPLAY

(71) Applicant: SAMSUNG DISPLAY CO., LTD., Yongin-si, Gyeonggi-do (KR)

(72) Inventors: Yang-Hwa Choi, Yongin-si (KR); Keum Nam Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/959,864

(22) Filed: Dec. 4, 2015

(65) Prior Publication Data

US 2016/0225836 A1 Aug. 4, 2016

(30) Foreign Application Priority Data

Feb. 2, 2015 (KR) ........................ 10-2015-0016350

(51) Int. Cl.
*H01L 51/05* (2006.01)
*H01L 51/00* (2006.01)
*H01L 27/32* (2006.01)

(52) U.S. Cl.
CPC ........ *H01L 51/055* (2013.01); *H01L 27/3262* (2013.01); *H01L 51/0097* (2013.01); *H01L 2251/5338* (2013.01)

(58) Field of Classification Search
CPC .................................................. H05K 7/20954
See application file for complete search history.

(56) References Cited

U.S. PATENT DOCUMENTS 7,279,375 B2   10/2007   Radosavljevic et al.

FOREIGN PATENT DOCUMENTS

| KR | 10-2007-0055509 A | 5/2007 |
| KR | 10-2009-0131903 A | 12/2009 |
| KR | 10-2014-0018623 A | 2/2014 |
| KR | 10-1400284 B1 | 5/2014 |

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

A foldable display according to the present disclosure includes: a substrate having a folding portion which is folded; and a plurality of transistors in the substrate each of the transistors including: a gate electrode on the substrate; a channel overlapping the gate electrode; and a source electrode and a drain electrode positioned at respective sides of the channel, wherein the gate electrode is divided into a plurality of sub-gate electrodes by at least one gate cutout.

15 Claims, 12 Drawing Sheets

FOLDABLE DISPLAY

CROSS-REFERENCE TO RELATED APPLICATION

This application claims priority to and the benefit of Korean Patent Application No. 10-2015-0016350 filed in the Korean Intellectual Property Office on Feb. 2, 2015, the entire contents of which are incorporated herein by reference.

BACKGROUND

1. Field

The present disclosure relates to a foldable display.

2. Description of the Related Art

As flat panel displays that are widely known, there are a liquid crystal display (LCD), a plasma display device (PDP), an organic light emitting diode display (OLED display), an electric field effect display (FED), and an electrophoretic display device (EPD).

To apply the flat panel display to various environments, a flexible display that can be easily bended, a foldable display that can be folded, a rollable display that can be rolled, a stretchable display that can be stretched, etc., have been researched.

When repeatedly folding and unfolding the foldable display, a transistor inside the pixel positioned at a folding portion may be damaged and an error of a transistor characteristic may be generated. For example, when a folding line of the folding portion and a current movement direction of the gate electrode are crossed, a portion of the gate electrode is folded such that it is difficult for the current to move smoothly in the portion of the gate electrode, thereby the error may be generated in the entire transistor.

The above information disclosed in this Background section is only for enhancement of understanding of the background of the disclosure and therefore it may contain information that does not form prior art.

SUMMARY

The present disclosure provides a foldable display for minimizing or reducing a failure of the folding portion.

A foldable display according to an exemplary embodiment of the present includes: a substrate having a folding portion which is folded; and a plurality of transistors on the substrate each of the transistors including: a gate electrode on the substrate; a channel overlapping the gate electrode; and a source electrode and a drain electrode positioned at respective sides of the channel, wherein the gate electrode is divided into a plurality of sub-gate electrodes by at least one gate cutout.

A portion of the plurality of transistors may be positioned on a folding line that is configured to be folded in the folding portion.

A portion of the gate cutout may be parallel to the folding line.

A scan line on the substrate and configured to transmit a scan signal, and a data line and a driving voltage line crossing the scan line and respectively configured to transmit a data voltage and a driving voltage may be further included, wherein the transistor may include a switching transistor connected to the scan line and the data line and including a switching drain electrode for outputting the data voltage, and a driving transistor including a driving source electrode connected to the switching drain electrode, and wherein the driving gate electrode of the driving transistor may be divided into a plurality of sub-driving gate electrodes by at least one driving gate cutout.

A switching gate electrode of the switching transistor may be divided into a plurality of sub-switching gate electrodes by at least one switching gate cutout.

The driving gate electrode or the switching gate electrode may be positioned on the folding line that is folded in the folding portion.

An organic light emitting diode electrically connected to a driving drain electrode of the driving transistor may be further included.

A foldable display according to another exemplary embodiment of the present disclosure includes: a substrate having a folding portion which is folded; and a transistor on the substrate including: a gate electrode on the substrate; a channel overlapping the gate electrode; and a source electrode and a drain electrode positioned at respective sides of the channel, wherein the channel is divided into a plurality of sub-channels by at least one channel cutout.

The transistor may be positioned on a folding line as a reference line that is folded in the folding portion.

A portion of the channel cutout maybe parallel to the folding line.

A scan line on the substrate and configured to transmit a scan signal, and a data line and a driving voltage line crossing the scan line and respectively configured to transmit a data voltage and a driving voltage may be further included, wherein the transistor may include a switching transistor connected to the scan line and the data line and including a switching drain electrode outputting the data voltage, and a driving transistor including a driving source electrode connected to the switching drain electrode, and wherein a driving channel of the driving transistor may be divided into a plurality of sub-driving channels by at least one driving channel cutout.

A switching channel of the switching transistor may be divided into a plurality of sub-switching channels by at least one switching channel cutout.

The driving channel or the switching channel may be positioned on the folding line as a reference line that is folded in the folding portion.

An organic light emitting diode electrically connected to a driving drain electrode of the driving transistor may be further included.

The driving channel may be curved in a plan view.

According to the present disclosure, by forming the gate cutout in the gate electrode to be divided into a plurality of sub-gate electrodes, or by forming the channel cutout in the channel to be divided into a plurality of sub-channels, the characteristic error of the transistor positioned on the folding line of the folding portion may be minimized, thereby minimizing the failure of the folding portion.

DETAILED DESCRIPTION

Figure 1:
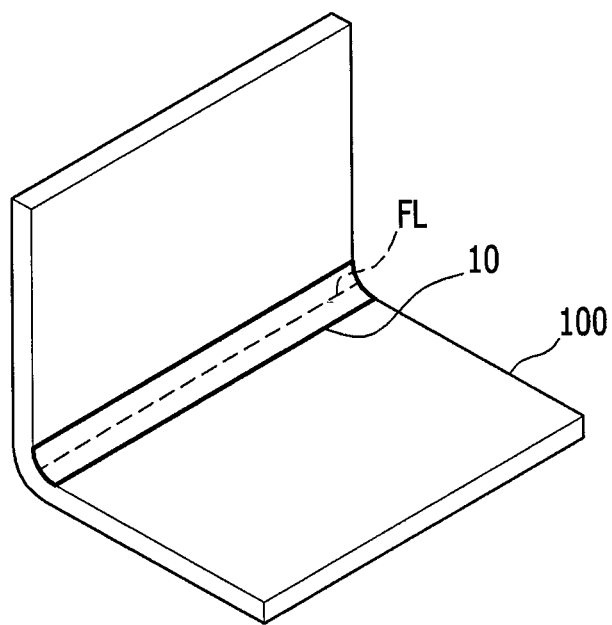
FIG. 1 is a perspective view of a foldable display according to an exemplary embodiment of the present disclosure.

In the following detailed description, only certain exemplary embodiments of the present disclosure have been shown and described, simply by way of illustration. As those skilled in the art would realize, the described embodiments may be modified in various different suitable ways, all without departing from the spirit or scope of the present disclosure.

Accordingly, the drawings and description are to be regarded as illustrative in nature and not restrictive. Like reference numerals designate like elements (or components) throughout the specification.

It will be understood that, although the terms "first", "second", "third", etc., may be used herein to describe various elements, components, regions, layers, and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section, without departing from the spirit and scope of the present invention.

In addition, the size and thickness of each configuration shown in the drawings are arbitrarily shown for better understanding and ease of description, but the present disclosure is not limited thereto.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the drawings, the thickness of layers, films, panels, regions, etc., are exaggerated for clarity. In the drawings, for better understanding and ease of description, the thickness of some layers and regions is exaggerated. It will be understood that when an element such as a layer, film, region, or substrate is referred to as being "on" another element, it can be directly on the other element or intervening elements (or components) may also be present.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments only and is not intended to be limiting of the present invention. As used herein, the singular forms "a" and "an" are intended to include the plural forms as well, unless the context clearly indicates otherwise.

In addition, unless explicitly described to the contrary, the terms "comprise," "comprises," "comprising," "includes," "including," and "include," will be understood to imply the inclusion of stated elements (or components) but not the exclusion of any other suitable elements (or components). Further, in the specification, the word "on" means positioning on or below the object portion, but does not essentially mean positioning on the upper side of the object portion based on a gravity direction.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Further, in the specification, the phrase "on a flat surface" means when an object portion is viewed from above, and the phrase "on a cross-section" means when a cross-section taken by vertically cutting an object portion is viewed from the side.

A person of skill in the art should also recognize that the process may be executed via hardware, firmware (e.g. via an ASIC), or in any combination of software, firmware, and/or hardware. Furthermore, the sequence of steps of the process is not fixed, but can be altered into any desired sequence as recognized by a person of skill in the art. The altered sequence may include all of the steps or a portion of the steps.

The display and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display may be formed on one integrated circuit (IC) chip or on separate IC chips. Further, the various components of the display may be implemented on a flexible printed circuit film, a tape carrier package (TCP), a printed circuit board (PCB), or formed on a same substrate as one or more circuits and/or devices. Further, the various components of the display may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Now, a foldable display according to an exemplary embodiment of the present disclosure will be described with reference to FIGS. 1, 2, 3, 4, 5, 6, 7, 8, and 9.

FIG. 1 is a perspective view of a foldable display according to an exemplary embodiment of the present disclosure.

As shown in FIG. 1, a foldable display 100 according to an exemplary embodiment of the present disclosure has a folding portion 10 as a portion that is folded. The foldable display 100 is folded with reference to a folding line FL positioned at the folding portion. A pixel positioned on the folding line FL may be easily damaged when a folding/unfolding operation is repeated in the foldable display 100.

This foldable display includes an organic light emitting device, wherein the organic light emitting device includes two electrodes and an organic emission layer interposed therebetween, and electrons injected from one electrode and holes injected from the other electrode are combined with each other in the organic emission layer to generate excitons, and the excitons emit energy to emit light. In an exemplary embodiment of the present disclosure, the organic light emitting device is described, however it is not limited thereto, and the present disclosure may be applied to various suitable foldable displays.

Figure 2:
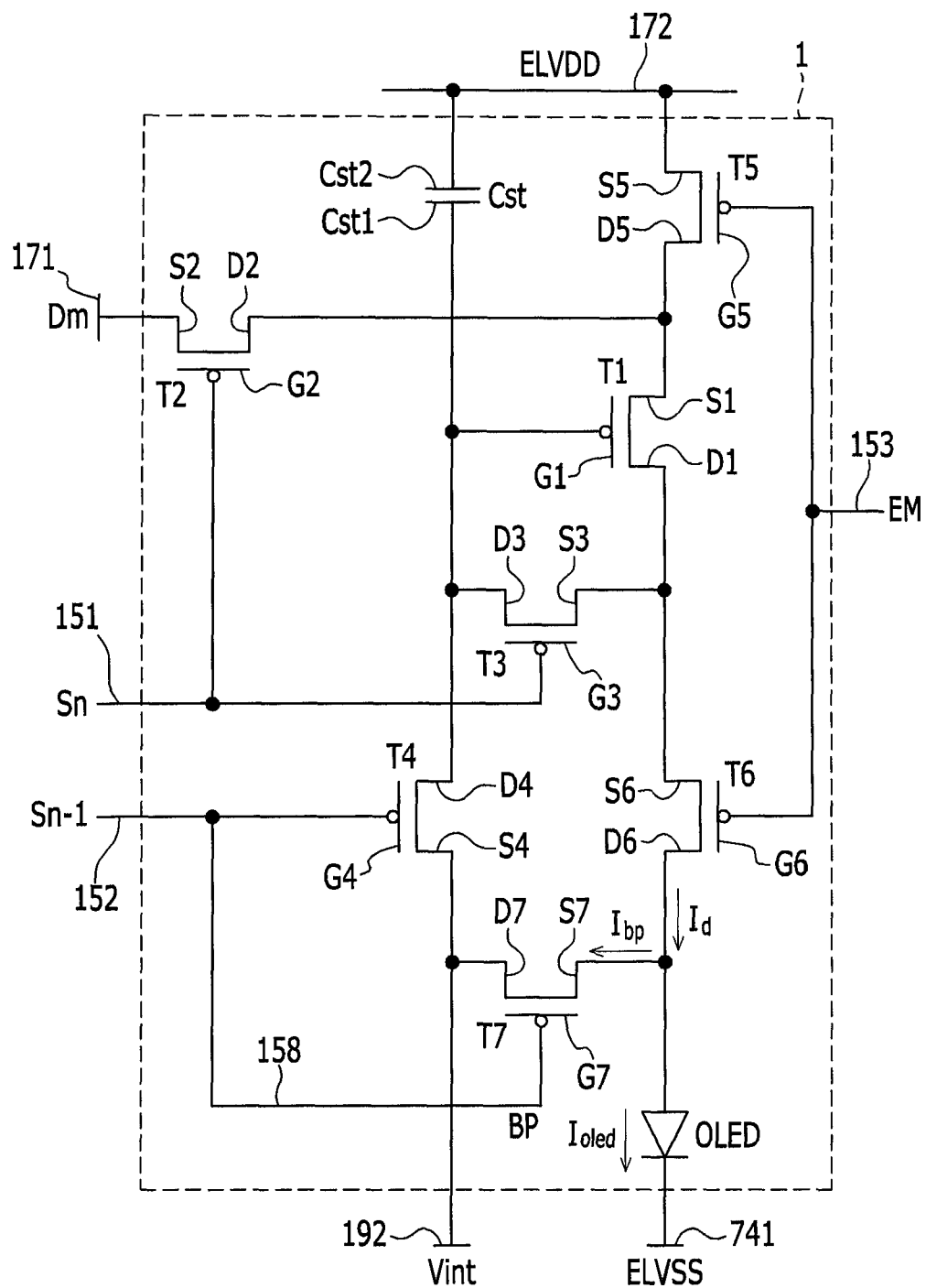
FIG. 2 is an equivalent circuit diagram of one pixel of a foldable display according to an exemplary embodiment of the present disclosure.

FIG. 2 is an equivalent circuit diagram of one pixel of a foldable display according to an exemplary embodiment of the present disclosure.

As shown in FIG. 2, one pixel 1 of the foldable display according to an exemplary embodiment of the present disclosure includes a plurality of signal lines 151, 152, 153, 158, 171, 172, and 192, a plurality of transistors T1, T2, T3, T4, T5, T6, and T7 connected to the plurality of signal lines, a storage capacitor Cst, and an organic light emitting diode OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 for transferring a scan signal Sn, a previous scan line 152 for transferring a previous scan signal Sn−1 to the initialization transistor T4, a light emission control line 153 for transferring a light emission control signal EM to the operation control transistor T5 and the light emission control transistor T6, a bypass control line 158 for transferring a bypass signal BP to the bypass transistor T7, a data line 171 crossing the scan line 151 and for transferring a data signal Dm, a driving voltage line 172 for transferring a driving voltage ELVDD and substantially parallel to the data line 171, and an initialization voltage line 192 for transferring an initialization voltage Vint for initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode OLED via the light emission control transistor T6. The driving transistor T1 receives the data signal Dm according to a switching operation of the switching transistor T2 to supply a driving current Id to the organic light emitting diode OLED.

A gate electrode G2 of the switching transistor T2 is connected with the scan line 121, a source electrode S2 of the switching transistor T2 is connected with the data line 171, and a drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the scan line 121 to perform a switching operation transferring the data signal Dm from the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and connected with an anode of the organic light emitting diode OLED via the emission control transistor T6, and a drain electrode D3 of the compensation transistor T3 is connected with one end Cst1 of the storage capacitor Cst, the drain electrode D4 of the initialization transistor T4, and the gate electrode G1 of the driving transistor T1. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected with the previous scan line 152, a source electrode S4 of the initialization transistor T4 is connected with the initialization voltage line 192, and a drain electrode D4 of the initialization transistor T4 is connected with one end Cst1 of the storage capacitor Cst and the gate electrode G1 of the driving transistor T1 via the drain electrode D3 of the compensation transistor T3. The initialization transistor T4 is turned on according to the previous scan signal Sn−1 received through the previous scan line 152 to transfer the initialization voltage Vint to the gate electrode G1 of the driving transistor T1 and perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the emission control transistor T6 is connected to the light emission control line 153, the source electrode S6 of the first emission control transistor T6 is connected to the drain electrode D1 of the driving transistor T1 and the source electrode S3 of the compensation transistor T3, and the drain electrode D6 of the first emission control transistor T6 is electrically connected to the anode of the organic light emitting diode OLED. The operation control transistor T5 and the first emission control transistor T6 are concurrently (e.g., simultaneously) turned on according to the emission control signal EM transmitted to the light emission control line 153 such that the driving voltage ELVDD is compensated through the diode-connected driving transistor T1 and is transmitted to the organic light emitting diode OLED.

A gate electrode G7 of the thin film bypass transistor T7 is connected to the bypass control line 158, a source electrode S7 of the bypass thin film transistor T7 is together connected to the drain electrode D6 of the light emission control thin film transistor T6 and the anode of the organic light emitting diode OLED together, and a drain electrode D7 of the bypass thin film transistor T7 is connected to the initialization voltage line 192 and the source electrode S4 of the initialization thin film transistor T4 together. Here, the bypass control line 158 is connected to the previous scan line 152 such that the bypass signal BP is the same as the previous scan signal S(n−1).

The other end Cst2 of the storage capacitor Cst is connected with the driving voltage line 172, and a cathode of the organic light emitting diode OLED is connected with a common voltage line 741 for transferring a common voltage ELVSS.

In an exemplary embodiment of the present disclosure, a 7-transistor and 1-capacitor structure, including the bypass transistor T7 is illustrated, but the present disclosure is not limited thereto, and the number of transistors and the number of capacitors may be variously modified, as those skilled in the art would appreciate.

Hereinafter, a detailed operation process of one pixel of the pixel unit of the organic light emitting diode display device according to an exemplary embodiment of the present disclosure will be described in detail with reference to FIG. 3.

Figure 3:
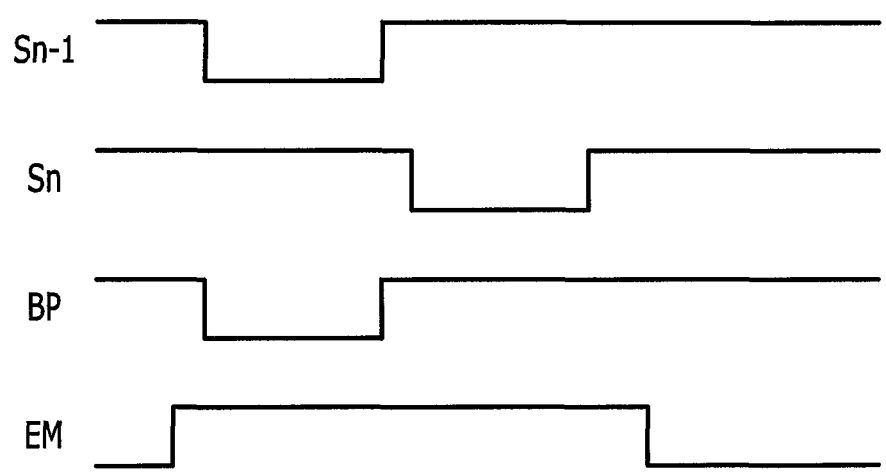
FIG. 3 is a timing diagram of signals applied to one pixel of a foldable display according to an exemplary embodiment of the present disclosure.

FIG. 3 is a timing diagram of signals applied to one pixel of a foldable display according to an exemplary embodiment of the present disclosure.

As shown in FIG. 3, first, for an initializing period, the previous scan signal S(n−1) having a low level is supplied through the previous scan line 152. The initializing thin film transistor T4 is turned on in response to the previous scan signal S(n−1) having the low level, the initial voltage Vint is connected to the gate electrode G1 of the driving transistor T1 from the initialization voltage line 192 through the initializing thin film transistor T4, and the driving thin film transistor T1 is initialized by the initialization voltage Vint.

Thereafter, for a data programming period, the scan signal Sn having a low level is supplied through the scan line 151. The switching thin film transistor T2 and the compensating thin film transistor T3 are turned on in response to the scan signal Sn having the low level. At this time, the driving transistor T1 is diode-connected through the turned-on compensation transistor T3 and is biased in a forward direction.

A compensation voltage Dm+Vth (Vth is a negative (−) value) reduced by a threshold voltage Vth of the driving thin film transistor T1 from a data signal Dm supplied from the data line 171, is applied to the gate electrode G1 of the driving thin film transistor T1. The driving voltage ELVDD and the compensation voltage (Dm+Vth) are applied to respective terminals of the storage capacitor Cst, and a charge corresponding to a voltage difference between the terminals is stored in the storage capacitor Cst.

Next, during the emission period, the emission control signal EM supplied from the emission control line 153 is changed from the high level into the low level. Thus, the operation control transistor T5 and the emission control transistor T6 are turned on by the emission control signal EM of the low level during the emission period.

Thus, a driving current Id is generated according to the voltage difference between the gate voltage of the gate electrode G1 of the driving transistor T1 and the driving voltage ELVDD, and the driving current Id is supplied to the organic light emitting diode(OLED) through the emission control transistor T6. The gate-source voltage Vgs of the driving thin film transistor T1 is maintained as "(Dm+Vth)−ELVDD" by the storage capacitor Cst for the emission period, and according to a current-voltage relationship of the driving thin film transistor T1, the driving current Id is proportional to the square "(Dm−ELVDD)$^2$" of a value obtained by subtracting the threshold voltage from the source-gate voltage. Accordingly, the driving current Id is determined regardless of the threshold voltage Vth of the driving thin film transistor T1.

The bypass transistor T7 receives the bypass signal BP from the bypass control line 158 and the a portion of the driving current Id is discharged as the bypass current Ibp through the bypass transistor T7.

When a small (e.g., minimum) current of the driving transistor T1, for displaying the black image, flows as the driving current and the organic light emitting diode (OLED) also emits, the black image is not normally displayed. Accordingly, the bypass transistor T7 of the organic light emitting diode display according to an exemplary embodiment of the present disclosure may disperse the portion of the small (e.g., minimum) current of the driving transistor T1 as the bypass current Ibp through the other current path beside of the current path of the organic light emitting diode side. Here, the small (e.g., minimum) current of the driving transistor T1 means the current in a condition that the driving transistor T1 is turned off since the gate-source voltage Vgs of the driving transistor T1 is smaller than the threshold voltage Vth. The small (e.g., minimum) driving current (for example, a current of 10 pA or less) under the condition in which the driving transistor T1 is turned off is transferred to the organic light emitting diode OLED to be expressed as an image with black luminance. When the small (e.g., minimum) driving current expressing the black image flows, an influence on a bypass transfer of the bypass current Ibp is large, but when a large driving current expressing an image such as a normal image or a white image flows, there may be little influence in the bypass current Ibp. Accordingly, when the driving current for displaying a black image flows, the light emission current Ioled of the organic light emitting diode OLED which is reduced by the current amount of the bypass current Ibp which flows out from the driving current Id through the bypass transistor T7 has a small (e.g., minimum) current amount as a level which may exactly express the black image. Therefore, a black luminance image is precisely displayed by using the bypass transistor T7, thereby improving a contrast ratio. In FIG. 3, the bypass signal BP is the same or substantially the same as a previous scan signal S(n−1), but is not necessarily limited thereto.

Next, the detailed structure of the foldable display according to an exemplary embodiment of the present disclosure will be described in detail with reference to FIG. 4, FIG. 5, FIG. 6, FIG. 7, FIG. 8, and FIG. 9.

Figure 4:
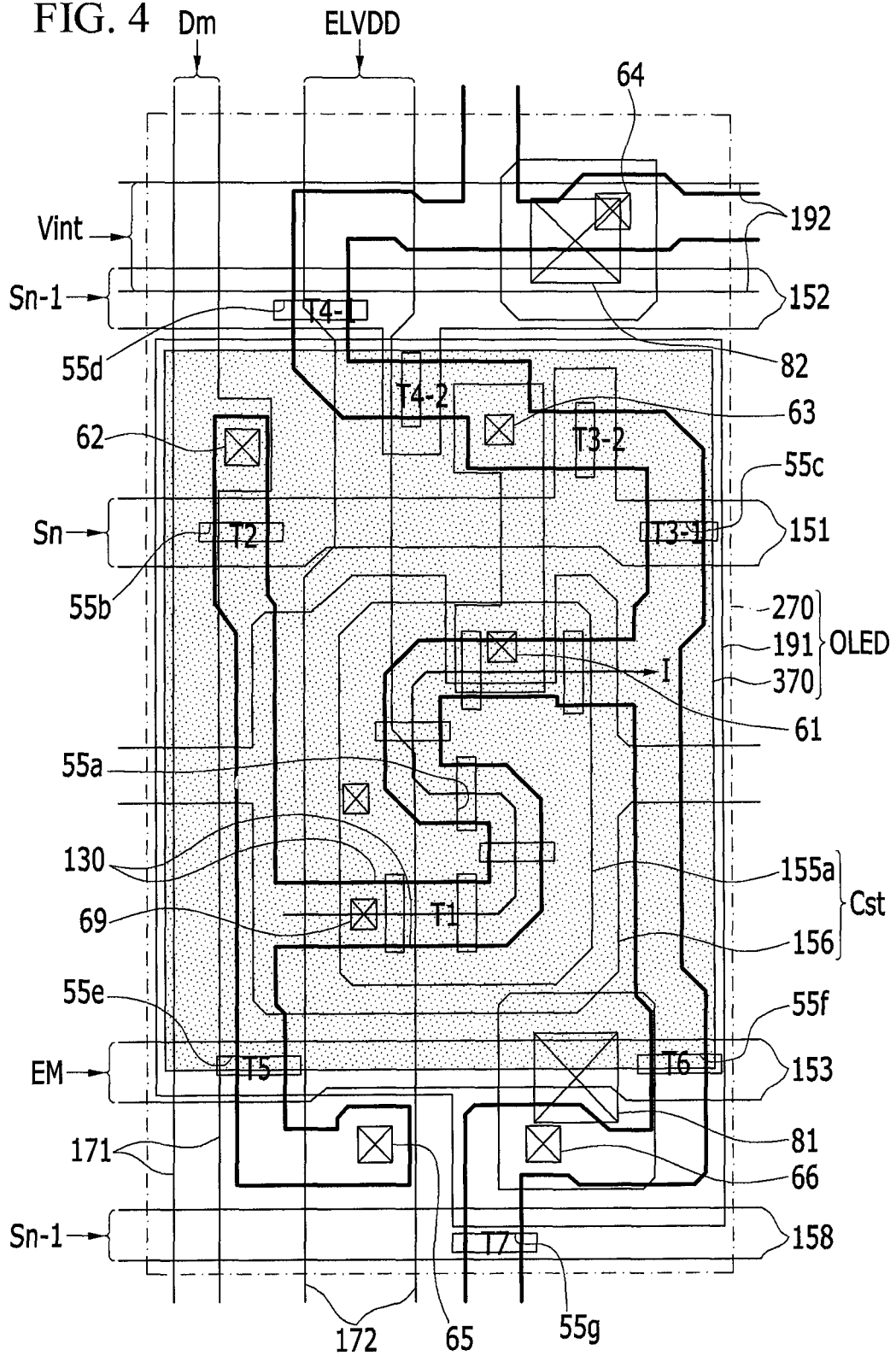
FIG. 4 is a schematic view showing a plurality of transistors and a capacitor of a foldable display according to an exemplary embodiment of the present disclosure.
Figure 5:
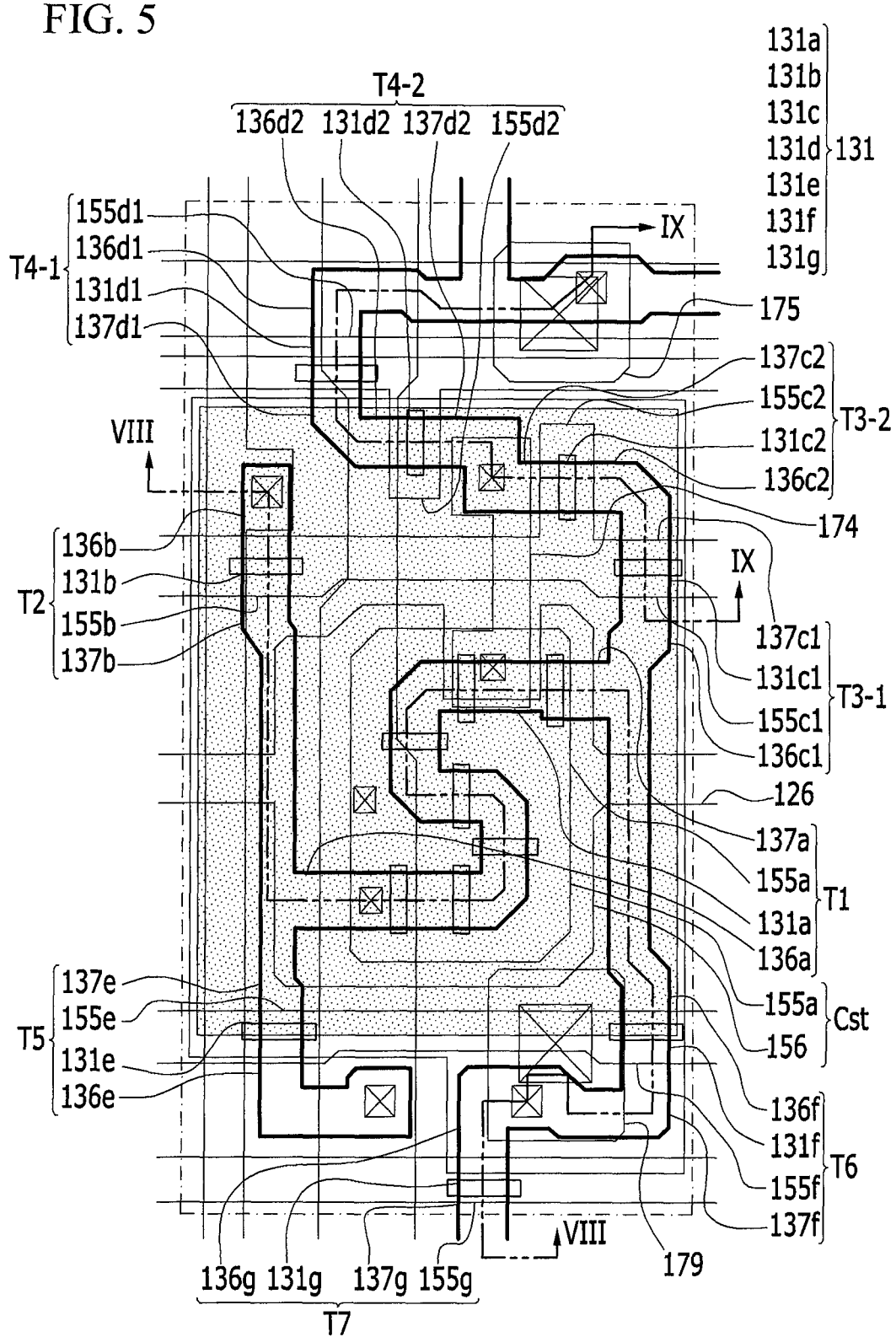
FIG. 5 is a detailed layout view of FIG. 4.
Figure 6:
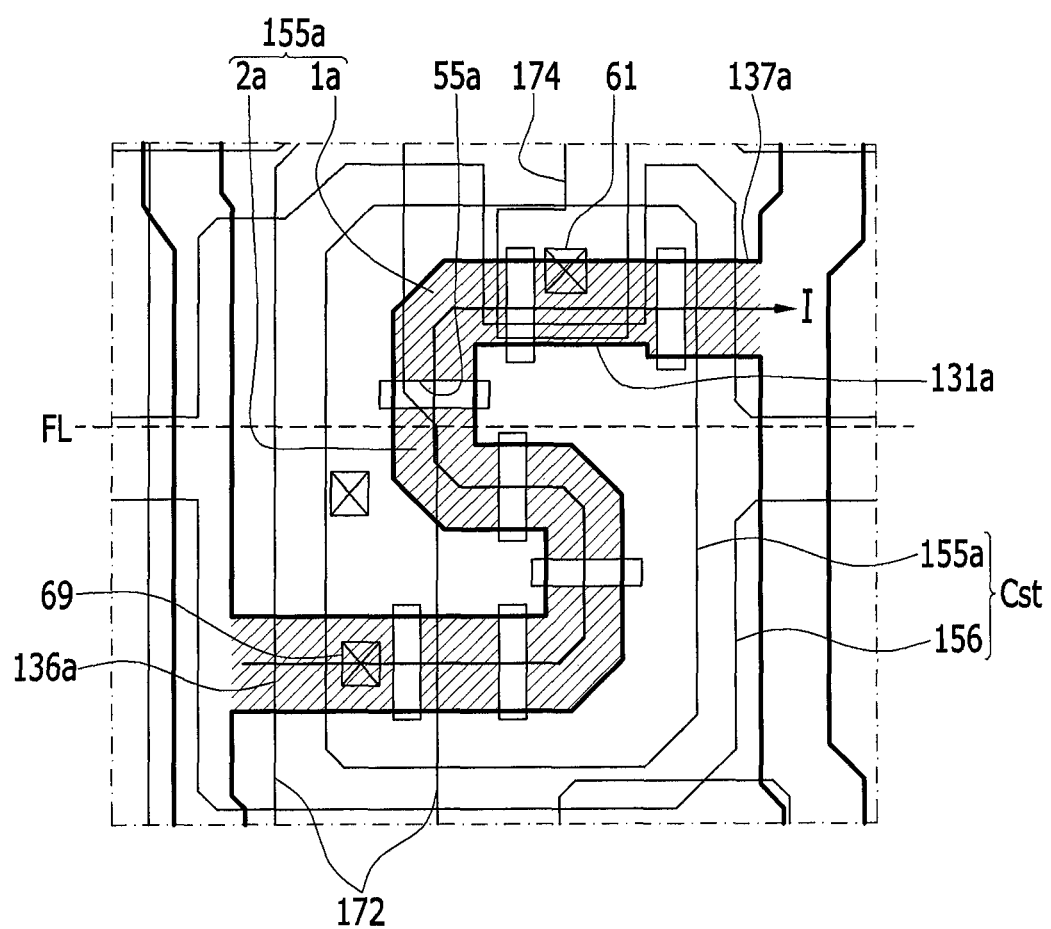
FIG. 6 is an enlarged layout view of the driving transistor of FIG. 5.
Figure 7:
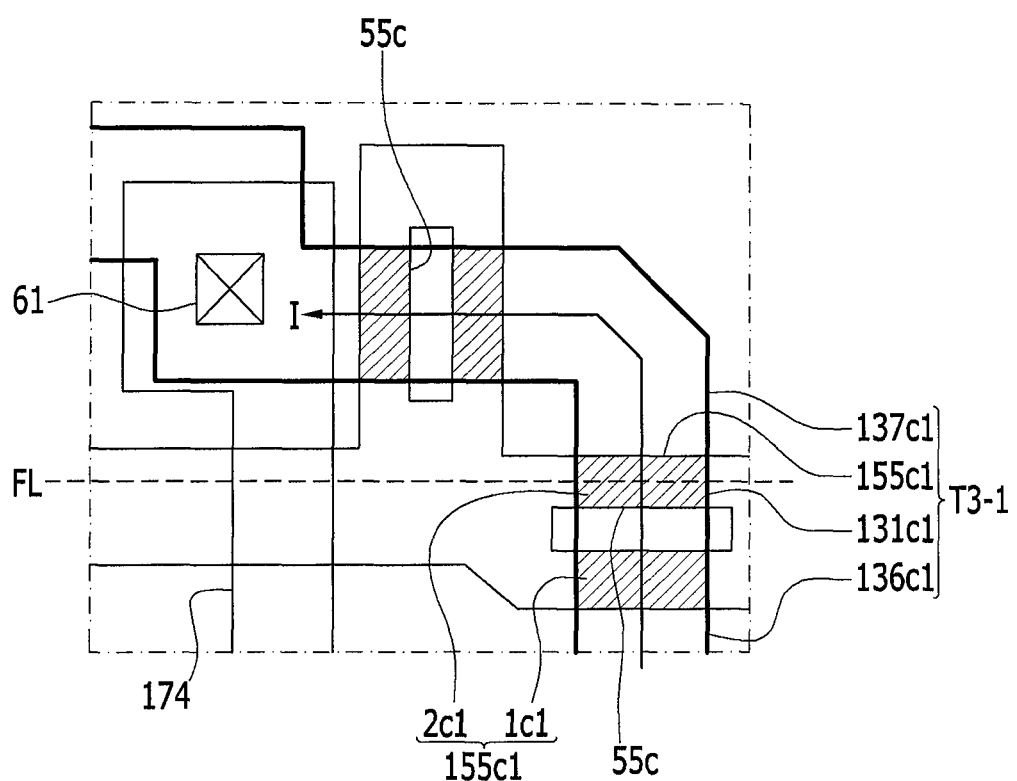
FIG. 7 is an enlarged layout view of the compensation transistor of FIG. 5.
Figure 8:
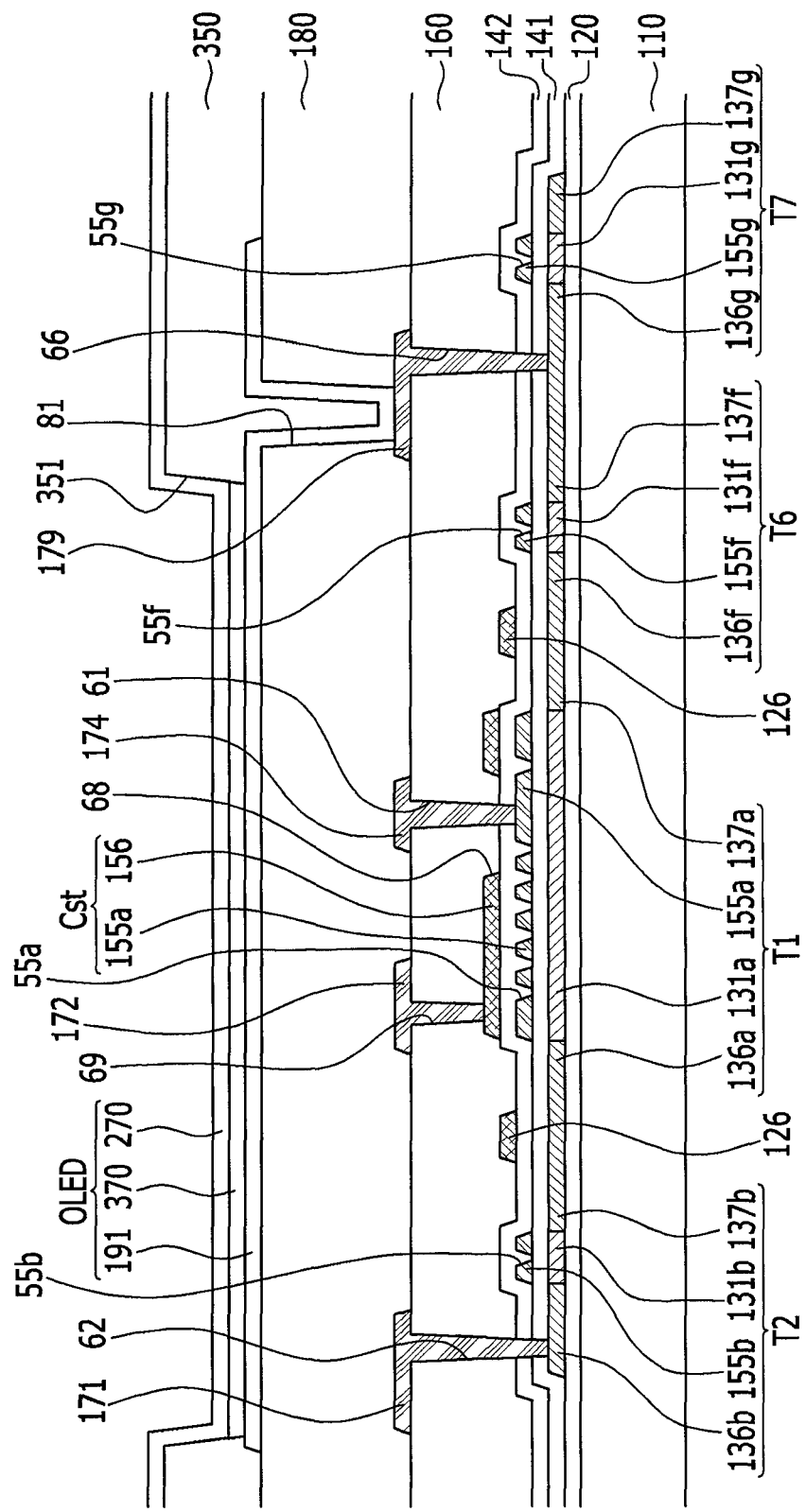
FIG. 8 is a cross-sectional view of the foldable display of FIG. 5 taken along the line VIII-VIII.
Figure 9:
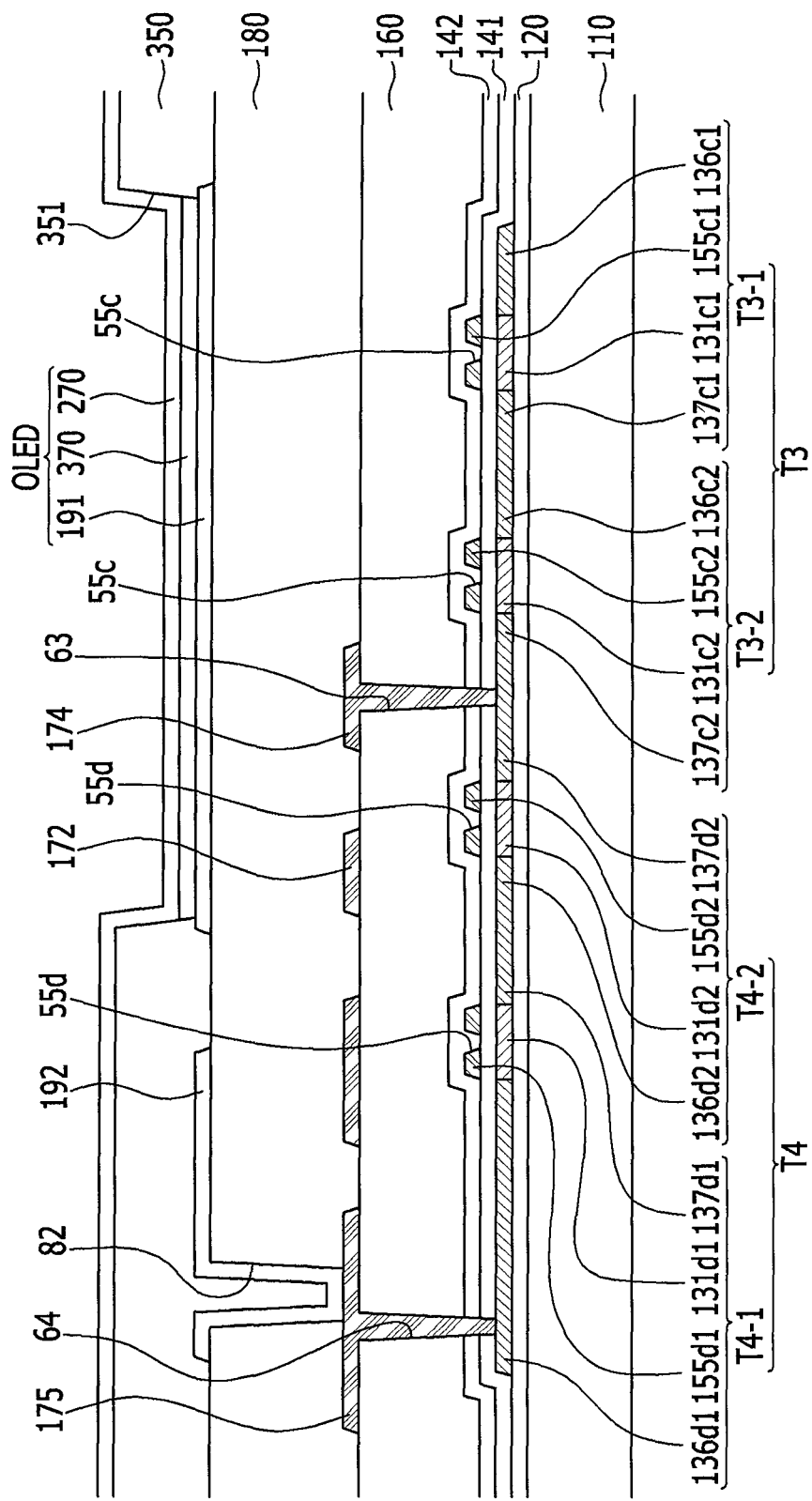
FIG. 9 is a cross-sectional view of the foldable display of FIG. 5 taken along the line IX-IX.

FIG. 4 is a schematic view showing a plurality of transistor and a capacitor of a foldable display according to an exemplary embodiment of the present disclosure, FIG. 5 is a detailed layout view of FIG. 4, FIG. 6 is an enlarged layout view of the driving transistor of FIG. 5, FIG. 7 is an enlarged layout view of the compensation transistor of FIG. 5, FIG. 8 is a cross-sectional view of the foldable display of FIG. 5 taken along the line VIII-VIII, and FIG. 9 is a cross-sectional view of the foldable display of FIG. 5 taken along the line IX-IX.

Hereinafter, a detailed planar structure of the foldable display according to an exemplary embodiment of the present disclosure will be first described in detail with reference to FIG. 4, FIG. 5, FIG. 6, and FIG. 7, and a detailed cross-sectional structure will be described in detail with reference to FIG. 8 and FIG. 9.

First, as shown in FIG. 4, the foldable display according to an exemplary embodiment of the present disclosure includes a scan line 151, a previous scan line 152, a light emission control line 153, and a bypass control line 158 for respectively transmitting a scan signal Sn, a previous scan signal Sn−1, an emission control signal EM, and a bypass signal BP to the pixel PX and extend in a row direction. Also, a data line 171 and a driving voltage line 172, which cross the scan line 151, the previous scan line 152, the emission control line 153, and the bypass control line 158 and respectively apply a data signal Dm and a driving voltage ELVDD to the pixel 1, are further included. The initialization voltage Vint is transmitted from the initialization voltage line 192 through the initialization transistor T4 to the compensation transistor T3.

Further, a driving thin film transistor T1, a switching thin film transistor T2, a compensation thin film transistor T3, an initialization thin film transistor T4, an operation control thin film transistor T5, an emission control thin film transistor T6, a bypass thin film transistor T7, a storage capacitor Cst, and an organic light emitting diode OLED are in the pixel 1. The organic light emitting diode (OLED) is made of a pixel electrode 191, an organic emission layer 370, and a common electrode 270. The compensation transistor T3 and the initialization transistor T4 are configured as a dual gate structure transistor in order to electrically isolate a leakage current.

Channels of the driving transistor T1, the switching transistor T2, the compensation transistor T3, the initialization transistor T4, the operation control transistor T5, the light emission control transistor T6, and the bypass transistor T7 are in one semiconductor 130 connected thereto, and the semiconductor 130 may be curved in various suitable shapes. The semiconductor 130 may be made of a polycrystalline semiconductor material or an oxide semiconductor material. The oxide semiconductor material may include any one oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. In the case where the semiconductor 130 is made of the oxide semiconductor material, a separate passivation layer for protecting the oxide semiconductor material which is vulnerable to an external environment such as a high temperature may be added.

The semiconductor 130 includes a channel which is doped with an N-type impurity or a P-type impurity, and a source doping region and a drain doping region which are at respective sides of the channel and doped with an opposite-type doping impurity to the doping impurity doped on the channel. In an exemplary embodiment, the source doping region and the drain doping region correspond to the source electrode and the drain electrode, respectively. The source electrode and the drain electrode in the semiconductor 130 may be formed by doping only the corresponding regions. Further, in the semiconductor 130, a region between source electrodes and drain electrodes of different transistors is doped and thus the source electrode and the drain electrode may be electrically connected to each other.

As illustrated in FIG. 5, the channels 131 includes a driving channel 131a in the drive transistor T1, a switching channel 131b in the switching transistor T2, a compensation channel 131c in the compensation transistor T3, an initialization channel 131d in the initialization transistor T4, an operation control channel 131e in the operation control transistor T5, a light emission control channel 131f in the light emission control transistor T6, and a bypass channel 131g in the bypass transistor T7.

The driving transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be elongated in a narrow space. Accordingly, a driving range of the gate voltage applied to the driving gate electrode 155a is increased by the elongated driving channel 131a. Since the driving range of the gate voltage is increased, a gray scale of light emitted from the organic light emitting diode OLED may be finely controlled by changing the magnitude of the gate voltage, and as a result, the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a overlaps with the driving channel 131a. The driving source electrode 136a and the driving drain electrode 137a are at respective sides of the driving channel 131a to be close. The driving gate electrode 155a is connected to a first data connecting member 174 through a contact hole 61.

The driving gate electrode 155a has at least one driving gate cutout 55a at the position overlapping the driving channel 131a. One driving gate cutout 55a is in a direction crossing a length direction I as a current movement direction of the driving channel 131a. A plurality of driving gate cutouts 55a are spaced from each other by an interval (e.g., a predetermined interval) along the length direction I of the driving channel 131a. As shown in FIG. 6, the plurality of driving gate cutouts 55a divide the driving gate electrode 155a of the position overlapping the driving channel 131a into a plurality of sub-driving gate electrodes 1a and 2a. Accordingly, although the driving gate electrode 155a is positioned on the folding line FL of the folding portion 10, when the portion among the driving gate cutout 55a is parallel to the folding line FL, only the sub-driving gate electrode 2a as the portion overlapping the folding line FL is damaged, but the sub-driving gate electrode 1a as the remaining portion that does not overlap the folding line FL is not damaged. Accordingly, the remaining sub-driving gate electrode 1a is normally operated such that the characteristic error is not generated in the driving transistor T1. In the present exemplary embodiment, the portion among the driving gate cutout 55a is parallel to the folding line FL, however it is not limited thereto, and the portion among the driving gate cutout 55a may be perpendicular to the folding line FL or to be oblique.

The switching transistor T2 includes the switching channel 131b, a switching gate electrode 155b, a switching source electrode 136b, and a switching drain electrode 137b. The switching gate electrode 155b, which is a part extended downward from the scan line 121, overlaps with the switching channel 131b and the switching source electrode 136b and the switching drain electrode 137b are at respective sides of the switching channel 131b to be close. The switching source electrode 136b is connected with the data line 171 through a contact hole 62.

The switching gate electrode 155b has at least one switching gate cutout 55b at the position overlapping the switching channel 131b. One switching gate cutout 55b is in the direction crossing the current movement direction of the switching channel 131b. The plurality of switching gate cutouts 55b removes the error of the characteristic of the switching transistor T2 positioned on the folding line FL of the folding portion 10 like the driving gate cutout 55a, thereby minimizing the failure of the folding portion 10.

Two compensation transistors T3 prevent or reduce the leakage current, and include a first compensation transistor T3-1 and a second compensation transistor T3-2 which are adjacent to each other. The first compensation transistor T3-1 is positioned around the scan line 121, and the second compensation transistor T3-2 is positioned around a projection of the scan line 121. The first compensation transistor T3-1 includes a first compensation channel 131c1, a first compensation gate electrode 155c1, a first compensation source electrode 136c1, and a first compensation drain electrode 137c1, and the second compensation transistor T3-2 includes a second compensation channel 131c2, a second compensation gate electrode 155c2, a second compensation source electrode 136c2, and a second compensation drain electrode 137c2.

The first compensation gate electrode 155c1, which is a part of the scan line 121, overlaps with the first compensation channel 131c1. The first compensation source electrode 136c1 and the first compensation drain electrode 137c1 are at respective sides of the first compensation channel 131c1 to be close. The first compensation source electrode 136c1 is connected with a light emission control source electrode 136f and the driving drain electrode 137a, and the first compensation drain electrode 137c1 is connected with the second compensation source electrode 136c2.

The second compensation gate electrode 155c2, which is a projection protruding upward from the scan line 121, overlaps with the second compensation channel 131c2. The second compensation source electrode 136c2 and the second compensation drain electrode 137c2 are at respective sides of the second compensation channel 131c2 to be close. The second compensation drain electrode 137c2 is connected with a first data connection member 174 through a contact hole 63.

The first compensation gate electrode 155c1 has at least one compensation gate cutout 55c at the position overlapping the first compensation channel 131c1. One first compensation gate cutout 55c is in the direction crossing the length direction I as the current movement direction of the first compensation channel 131c1. A plurality of compensation gate cutouts 55c are spaced from each other by the interval (e.g., the predetermined interval) along the length direction I of the first compensation channel 131c1. As shown in FIG. 7, the plurality of compensation gate cutouts 55c divide the first compensation gate electrode 155c1 of the position overlapping the first compensation channel 131c1 into a plurality of sub-first compensation gate electrodes 1c1 and 2c1. Accordingly, although the first compensation gate electrode 155c1 is positioned on the folding line FL of the folding portion 10, when the portion among the compensation gate cutout 55c is parallel to the folding line FL, only the sub-first compensation gate electrode 2c1 as the portion overlapping the folding line FL is damaged, but the sub-first compensation gate electrode 1c1 as the remaining portion that does not overlap the folding line FL is not damaged. Accordingly, the remaining sub-first compensation gate electrode 1c1 is normally operated such that the characteristic error is not generated in the first compensation transistor T3-1. Likewise, the second compensation gate electrode 155c2 also has at least one compensation gate cutout 55c having the same or substantially the same effect at the position overlapping the second compensation channel 131c2.

Two initialization transistors T4 prevent or reduce the leakage current, and include a first initialization transistor T4-1 and a second initialization transistor T4-2 which are adjacent to each other. The first initialization transistor T4-1 is positioned around the previous scan line 152, and the second initialization transistor T4-2 is positioned around a projection of the previous scan line 152. The first initialization transistor T4-1 includes a first initialization channel 131d1, a first initialization gate electrode 155d1, a first initialization source electrode 136d1, and a first initialization drain electrode 137d1. The second initialization transistor T4-2 includes a second initialization channel 131d2, a second initialization gate electrode 155d2, a second initialization source electrode 136d2, and a second initialization drain electrode 137d2.

The first initialization gate electrode 155d1, which is a part of the previous scan line 152, overlaps with the first initialization channel 131d1 and is at both sides of the first initialization channel 131d1 to be close. The first initialization source electrode 136d1 is connected with a second data connection member 175 through a contact hole 64, and the first initialization drain electrode 137d1 is connected with the second initialization source electrode 136d2.

The second initialization gate electrode 155d2, which is a projection protruding downward from the previous scan line 152, overlaps with the second initialization channel 131d2.

The second initialization source electrode 136d2 and the second initialization drain electrode 137d2 are at respective sides of the second initialization channel 131c2 to be close. The second initialization drain electrode 137d2 is connected with the first data connection member 174 through the contact hole 63.

The first initialization gate electrode 155d1 and the second initialization gate electrode 155d2 respectively include an initialization gate cutout 55d at the position overlapping the first initialization channel 131d1 and the second initialization channel 131d2. Each initialization gate cutout 55d is in the direction crossing the current movement direction of the first initialization channel 131d1 and the second initialization channel 131d2. A plurality of initialization gate cutouts 55d remove the characteristic error of the initialization transistor T4 positioned on the folding line FL of the folding portion 10 like the compensation gate cutout 55c, thereby minimizing the failure of the folding portion 10.

As such, the compensation transistor T3 includes two of the first compensation transistor T3-1 and the second compensation transistor T3-2, while the initialization transistor T4 includes two of the first initialization transistor T4-1 and the second initialization transistor T4-2, and as a result, it is possible to efficiently prevent or reduce the leakage current from being generated by blocking an electron moving path of the semiconductor 130 in the off state.

The operation control transistor T5 includes the operation control channel 131e, an operation control gate electrode 155e, an operation control source electrode 136e, and an operation control drain electrode 137e. The operation control gate electrode 155e, which is a part of the light emission control line 153, overlaps with the operation control channel 131e. The operation control source electrode 136e and the operation control drain electrode 137e are at respective sides of the operation control channel 131e to be close. The operation control source electrode 136e is connected with a part of the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f, which is a part of the light emission control line 153, overlaps with the light emission control channel 131f. The emission control source electrode 136f and the emission control drain electrode 137f are at respective sides of the emission control channel 131f to be close. The light emission control drain electrode 137f is connected with a third data connection member 179 through a contact hole 66.

The bypass transistor T7 includes the bypass channel 131g, a bypass gate electrode 155g, a bypass source electrode 136g, and a bypass drain electrode 137g. The bypass gate electrode 155g, which is a part of the bypass control line 128, overlaps with the bypass channel 131g. The bypass source electrode 136g and the bypass drain electrode 137g are at respective sides of the bypass channel 131g to be close. The bypass source electrode 136g is connected through a contact hole 81 to the third data connecting member 179, and the bypass drain electrode 137g is connected directly with the first initialization source electrode 136d1.

The operation control gate electrode 155e, the light emission control gate electrode 155f, and the bypass electrode 155g respectively have an operation control gate cutout 55e, a light emission control gate cutout 55f, and a bypass gate cutout 55g respectively overlapping the operation control channel 131e, the light emission control bypass gate channel 131f, and the bypass channel 131g. The operation control gate cutout 55e, the light emission control gate cutout 55f, and the bypass gate cutout 55g remove the characteristic error of the operation control transistor T5, the light emission control transistor T6, and the bypass transistor T7 positioned on the folding line FL of the folding portion 10 like the initialization gate cutout 55d, thereby minimizing the failure of the folding portion 10.

One end of the driving channel 131a of the driving transistor T1 is connected with the switching drain electrode 137b and the operation control drain electrode 137e, and the other end of the driving channel 131a is connected with the compensation source electrode 136c and the light emission control source electrode 136f.

The storage capacitor Cst includes a first storage electrode 155a and a second storage electrode 156 which have a second insulating layer 142 therebetween. The first storage electrode 155a corresponds to the driving gate electrode 155a, and the second storage electrode 156 is a portion extended from a storage line 126, occupies a larger area than the driving gate electrode 155a, and fully covers the driving gate electrode 155a. Herein, a second insulating layer 142 is a dielectric material, and a storage capacitance is determined by charges stored in the storage capacitor Cst and a voltage between the two electrodes 155a and 156. As such, the driving gate electrode 155a is used as the first storage electrode 155a, and as a result, it is possible to ensure a space in which the storage capacitor may be formed within a space narrowed by the driving channel 131a having a large area in the pixel.

The first storage electrode 155a, which is the driving gate electrode 155a, is connected with one end of the first data connection member 174 through the contact hole 61 and a storage opening 68. The storage opening 68 is an opening in the second storage electrode 156. The first data connection member 174 is on the same layer as the data line 171, to be substantially parallel to the data line 171, and the other end of the first data connection member 174 is connected with the second compensation drain electrode 137c2 of the second compensation transistor T3-2 and the second initialization drain electrode 137d2 of the second initialization transistor T4-2 through the contact hole 63. Accordingly, the first data connection member 174 connects the driving gate electrode 155a, the second compensation drain electrode 137c2 of the second compensation transistor T3-2, and the second initialization drain electrode 137d2 of the second initialization transistor T4-2, to each other.

The second storage electrode 156 is connected with the driving voltage line 172 through a contact hole 69.

Accordingly, the storage capacitor Cst stores a storage capacitance corresponding to a difference between the driving voltage ELVDD transferred to the second storage electrode 156 through the driving voltage line 172 and the gate voltage Vg of the driving gate electrode 155a.

The third data connection member 179 is connected with the pixel electrode 191 through the contact hole 81 and the second data connection member 175 is connected with the initialization voltage line 192 through a contact hole 82.

Hereinafter, cross-sectional structures of the pixel unit and the peripheral unit in the organic light emitting diode display device according to an exemplary embodiment of the present disclosure will be described in detail according to a lamination order with reference to FIG. 8 and FIG. 9.

Since a lamination structure of the operation control transistor T5 is mostly the same or substantially the same as that of the light emission control transistor T6, a detailed description thereof will be omitted.

A buffer layer 120 may be formed on a pixel substrate 110. The substrate 110 may be formed as an insulating substrate made of glass, crystal, ceramic, plastic, and the like, and the buffer layer 120 blocks impurities from the substrate 110 during a crystallization process for forming a polycrystalline semiconductor to serve to improve characteristics of the polycrystalline semiconductor and reduce stress applied to the substrate 110.

A semiconductor 130 is formed on the buffer layer 120 and includes a driving channel 131a, a switching channel 131b, a compensation channel 131c, an initialization channel 131d, an operation control channel 131e, and a light emission control channel 131f. A driving source electrode 136a and a driving drain electrode 137a are formed on respective sides of the driving channel 131a in the semiconductor 130. A switching source electrode 136b and a switching drain electrode 137b are formed on respective sides of the switching channel 131b.

In addition, a first compensation source electrode 136c1 and a first compensation drain electrode 137c1 are formed on respective sides of a first compensation channel 131c1, a second compensation source electrode 136c2 and a second compensation drain electrode 137c2 are formed on respective sides of a second compensation channel 131c2, a first initialization source electrode 136d1 and a first initialization drain electrode 137d1 are formed on respective sides of a first initialization channel 131d1, and a second initialization source electrode 136d2 and a second initialization drain electrode 137d2 are formed on respective sides of a second initialization channel 131d2.

Further, an operation control source electrode 136e and an operation control drain electrode 137e are formed on respective sides of the operation control channel 131e. A light emission control source electrode 136f and a light emission control drain electrode 137f are formed on respective sides of the light emission control channel 131f. Also, a bypass source electrode 136g and a bypass drain electrode 137g are formed at respective sides of the bypass channel 131g.

A first gate insulating layer 141 covering the semiconductor 130 is formed on semiconductor 130. First gate wires 151, 152, 153, 158, 155a, 155b, 155c1, 155c2, 155d1, 155d2, 155e, and 155f which include a scan line 151 including a switching gate electrode 155b, a first compensation gate electrode 155c1, a second compensation gate electrode 155c2, a previous scan line 152 including a first initialization gate electrode 155d1 and a second initialization gate electrode 155d2, a light emission control line 153 including an operation control gate electrode 155e and a light emission control gate electrode 155f, a bypass control line 158 including the bypass gate electrode 155g, and a driving gate electrode (first storage electrode) 155a are formed on the first gate insulating layer 141.

A second gate insulating layer 142 covering the first gate wires 151, 152, 153, 158, 155a, 155b, 155c1, 155c2, 155d1, 155d2, 155e, and 155f and the first gate insulating layer 141 is formed thereon. The first insulating layer 141 and the second insulating layer 142 may be made of a silicon nitride (SiNx) or a silicon oxide (SiOx).

Second gate wires 126 and 156 including a storage line 126 are parallel to the scan line 121 and a second storage electrode 156 which is a portion extended from the storage line 126 are formed on the second insulating layer 142.

An interlayer insulating layer 160 is formed on the second gate insulating layer 142 and the second gate wires 126 and 156. The interlayer insulating layer 160 is made of a silicon nitride (SiNx) or a silicon oxide (SiOx).

The interlayer insulating layer 160 has contact holes 61, 62, 63, 64, 65, 66, and 69. Data wires 171, 172, 174, 175, and 179 including a data line 171, a driving voltage line 172, a first data connecting member 174, a second data connecting member 175, and a third data connecting member 179 are formed on the interlayer insulating layer 160.

The data line 171 is connected to the switching source electrode 136b through the contact hole 62 formed in the first gate insulating layer 141, the second gate insulating layer 142, and the interlayer insulating layer 160, one end of the first data connecting member 174 is connected to the first storage electrode 155a through the contact hole 61 formed in the second gate insulating layer 142 and the interlayer insulating layer 160, and the other end of the first data connecting member 174 is connected to the second compensation drain electrode 137c2 and the second initialization drain electrode 137d2 through the contact hole 63 formed in the first gate insulating layer 141, the second gate insulating layer 142, and the interlayer insulating layer 160.

A quadrangular second data connection member 175 is connected with the first initialization source electrode 136d1 through the contact hole 64 formed in the first gate insulating layer 141, the second gate insulating layer 142, and the interlayer insulating layer 160. In addition, a quadrangular third data connection member 179 is connected with the light emission control drain electrode 137f through the contact hole 66 formed in the first gate insulating layer 141, the second gate insulating layer 142, and the interlayer insulating layer 160.

A passivation layer 180 covering the data wires 171, 172, 174, 175, and 179, and the interlayer insulating layer 160 is formed thereon. The passivation layer 180 may be formed by an organic layer.

The pixel electrode 191 and the initialization voltage line 192 are formed on the passivation layer 180. The third data connection member 179 is connected with the pixel electrode 191 through a contact hole 81 formed on the passivation layer 180, and the second data connection member 175 is connected with the initialization voltage line 192 through a contact hole 82 formed on the passivation layer 180.

A pixel defining layer (PDL) 350, covering the passivation layer 180, the initialization voltage line 192, and the pixel electrode 191, is formed on edges of the passivation layer 180, the initialization voltage line 192, and the pixel electrode 191, and the pixel defining layer 350 has a pixel opening 351 that exposes the pixel electrode 191. The pixel defining layer 350 may be made of a resin such as a polyacrylate resin and a polyimide resin or silica-series inorganic materials.

An organic emission layer 370 is formed on the pixel electrode 191 exposed by the pixel opening 351, and a common electrode 270 is formed on the organic emission layer 370. The common electrode 270 is formed on the pixel defined layer 350 to be formed through the plurality of pixels. As such, an organic light emitting diode OLED is formed, which includes the pixel electrode 191, the organic emission layer 370, and the common electrode 270.

Herein, the pixel electrode 191 is an anode which is a hole injection electrode, and the common electrode 270 is a cathode which is an electron injection electrode. However, the present disclosure is not necessarily limited thereto, and the pixel electrode 191 may be the cathode and the common electrode 270 may be the anode according to a driving method of the organic light emitting diode display. When holes and electrons are injected into the organic emission layer 370 from the pixel electrode 191 and the common electrode 270, respectively, and excitons acquired by combining the injected holes and electrons fall from an excitation state to a ground state, light is emitted.

The organic emission layer 370 is made of a low-molecular organic material or a high-molecular organic material such as poly(3,4-ethylenedioxythiophene) (PEDOT). Further, the organic emission layer 370 may be formed by multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is on the pixel electrode 191 which is the positive electrode, and the hole transporting layer, the emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

The white organic emission layer described in another example may be, of course, formed by one organic emission layer, and includes even a configuration that may emit white light by laminating a plurality of organic emission layers. As an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the organic light emitting diode OLED may be formed on the common electrode 270, and the encapsulation member may be sealed to the substrate 110 by a sealant and may be formed of various suitable materials such as glass, quartz, ceramic, plastic, and a metal. A thin film encapsulation layer may be formed on the common electrode 270 by depositing the inorganic layer and the organic layer with the usage of the sealant.

Further, in an exemplary embodiment, the gate cutout is formed in the gate electrode to be divided into a plurality of sub-gate electrodes, however the channel cutout may be formed in the channel to divide a plurality of sub-channels as another exemplary embodiment.

Next, the foldable display according to another exemplary embodiment of the present disclosure will be described in detail with reference to FIG. 10, FIG. 11, and FIG. 12.

Figure 10:
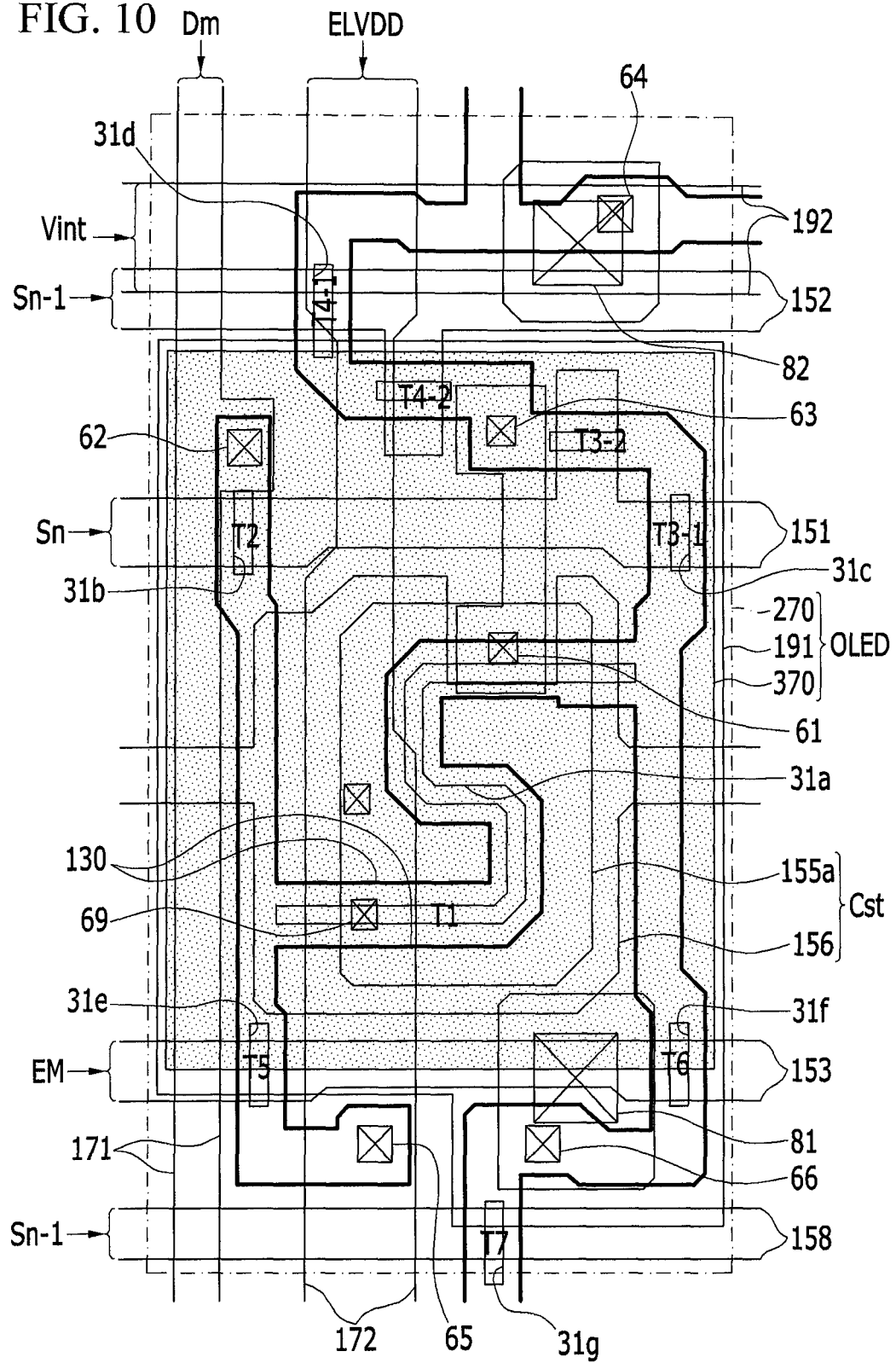
FIG. 10 is a detailed layout view of a foldable display according to another exemplary embodiment of the present disclosure.
Figure 11:
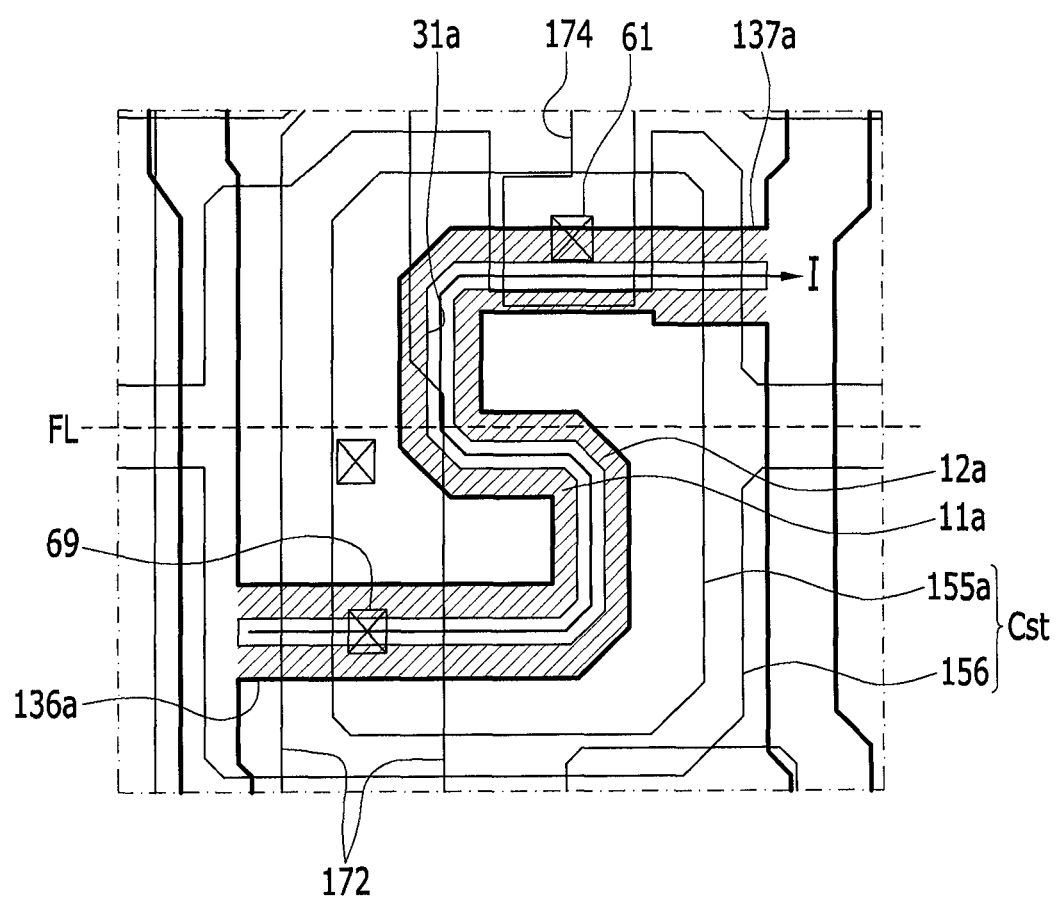
FIG. 11 an enlarged layout view of the driving transistor of FIG. 10.
Figure 12:
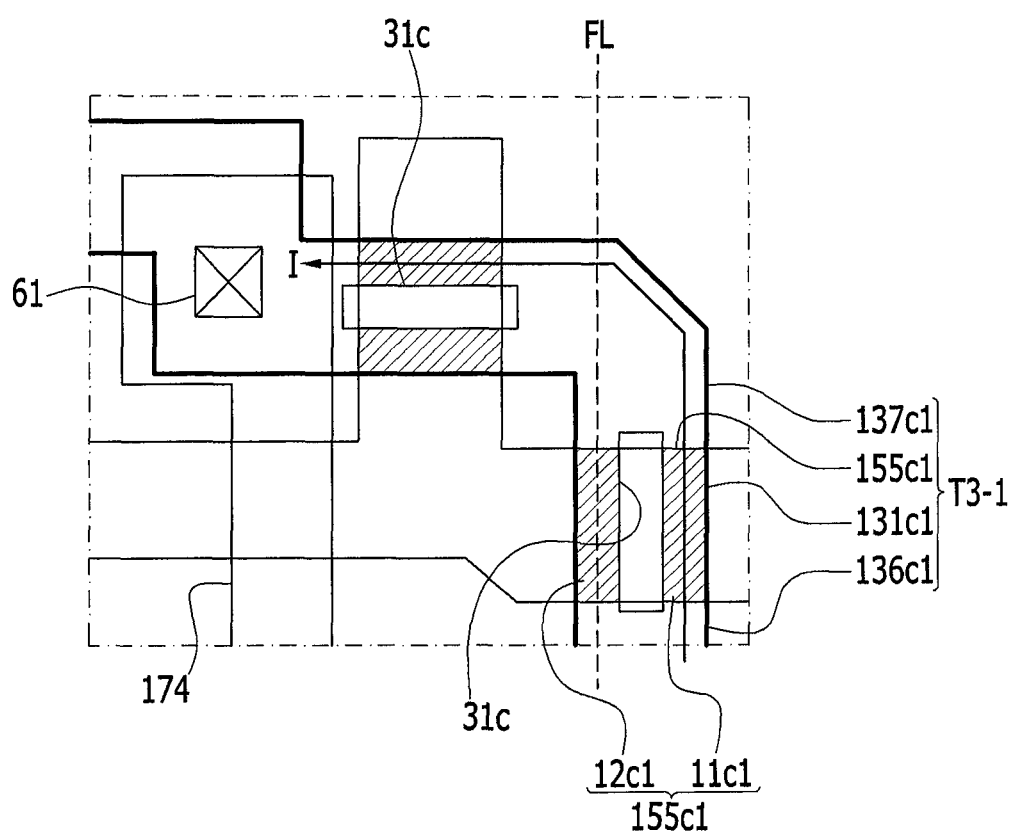
FIG. 12 an enlarged layout view of the compensation transistor of FIG. 10.

FIG. 10 is a detailed layout view of a foldable display according to another exemplary embodiment of the present disclosure, FIG. 11 is an enlarged layout view of the driving transistor shown in FIG. 10, and FIG. 12 is an enlarged layout view of the compensation transistor of FIG. 10.

The exemplary embodiment shown in FIG. 10, FIG. 11 and FIG. 12 is substantially the same as the exemplary embodiment shown in FIG. 1, FIG. 2, FIG. 3, FIG. 4, FIG. 5, FIG. 6, FIG. 7, FIG. 8, and FIG. 9, except for forming the channel cutout in the channel to be divided into a plurality of sub-channels such that the repeated description may be omitted.

As shown in FIG. 10, FIG. 11, and FIG. 12, the channel of the foldable display according to an exemplary embodiment of the present disclosure includes a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving channel 131a has a driving channel cutout 31a at a position overlapping the driving gate electrode 155a. The driving channel cutout 31a is formed in the direction parallel to the length direction I as the current movement direction of the driving channel 131a. As shown in FIG. 11, the driving channel cutout 31a divides the driving channel 131a into a pair of sub-driving channels 11a and 12a. Accordingly, although the driving channel 131a is positioned on the folding line FL of the folding portion 10, when the portion of the driving channel cutout 31a is parallel to the folding line FL, only the sub-driving channel 12a of the portion overlapping the folding line FL is damaged, but the remaining sub-driving channel 11a that does not overlap the folding line FL is not damaged. Accordingly, the remaining sub-driving channel 11a is normally operated such that the error characteristic is not generated in the driving transistor T1. In the present exemplary embodiment, the portion of the driving channel cutout 31a is parallel to the folding line FL, however it is not limited thereto, and the portion of the driving channel cutout 31a may be perpendicular or oblique to the folding line FL.

The switching channel 131b has a switching channel cutout 31b at the position overlapping the switching gate electrode 155b. The switching channel cutout 31b is formed in the direction parallel to the current movement direction of the switching channel 131b. The switching channel cutout 31b removes the characteristic error of the switching transistor T2 positioned on the folding line FL of the folding portion 10 like the driving channel cutout 31a, thereby minimizing the failure of the folding portion 10.

The first compensation channel 131c1 has a compensation channel cutout 31c at the position overlapping the first compensation gate electrode 155c1. The compensation channel cutout 31c is formed in the direction parallel to the length direction I as the current movement direction of the first compensation channel 131c1. As shown in FIG. 12, the compensation channel cutout 31c divides the first compensation channel 131c1 into a pair of sub-first compensation channels 11c1 and 12c1. Accordingly, although the first compensation channel 131c1 is positioned on the folding line FL of the folding portion 10, when the portion of the compensation channel cutout 31c is parallel to the folding line FL, only the sub-first compensation channel 12c1 of the portion overlapping the folding line FL is damaged, but the sub-first compensation channel 11c1 that does not overlap the folding line FL is not damaged. Accordingly, the remaining sub-first compensation channel 11c1 is normally operated such that the characteristic error is not generated in the first compensation transistor T3-1. Likewise, the second compensation channel 131c2 also has a compensation channel cutout 31c having the same or substantially the same effect at the position overlapping the second compensation gate electrode 155c2.

Similarly, the first initialization channel 131d1, the second initialization channel 131d2, the operation control channel 131e, the light emission control channel 131f, and the bypass channel 131g respectively have the initialization channel cutout 31d, the operation control channel cutout 31e, the light emission control channel cutout 31f, and the bypass channel cutout 31g at the positions overlapping the first initialization gate electrode 155d1 and the second initialization gate electrode 155d2, the operation control gate electrode 155e, the light emission control gate electrode 155f, and the bypass gate electrode 155g. The initialization channel cutout 31d. The operation control channel cutout 31e, the light emission control channel cutout 31f, and the bypass channel cutout 31g, remove the characteristic error of the initialization transistor T4, the operation control transistor T5, the light emission control transistor T6, and the bypass transistor T7 positioned on the folding line FL of the folding portion 10 like the switching channel cutout 31b, thereby minimizing the failure of the folding portion 10.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims, and their equivalents.

| Description of some of the symbols | |
|---|---|
| 31a: driving channel cutout | 31b: switching channel cutout |
| 31c: compensation channel cutout | 31d: initialization channel cutout |
| 31e: operation control channel cutout | 31f: light emission control channel cutout |
| 31g: bypass channel cutout | 55a: driving gate cutout |
| 55b: switching gate cutout | 55c: compensation gate cutout |
| 55d: initialization gate cutout | 55e: operation control gate cutout |
| 55f: light emission control gate cutout | 55g: bypass gate cutout |
| 151: scan line | 152: previous scan line |
| 153: light emission control line | 158: bypass control line |
| 155a: driving gate electrode | 155b: switching gate electrode |
| 131a: driving channel | 132b: switching channel |
| 141: first gate insulating layer | 142: second gate insulating layer |
| 160: interlayer insulating layer | 171: data line |
| 172: driving voltage line | |

What is claimed is:

1. A foldable display comprising:
a substrate comprising a folding portion configured to be folded; and
a plurality Of transistors on the substrate, each of the transistors comprising:
a gate electrode on the substrate;
a channel overlapping the gate electrode; and
a source electrode and a drain electrode positioned at respective sides of the channel,
wherein the gate electrode is divided into a plurality of sub-gate electrodes by at least one gate cutout.

2. The foldable display of claim 1,
wherein a portion of the plurality of transistors is positioned on a folding line configured to be folded in the folding portion.

3. The foldable display of claim 2,
wherein the portion of the gate cutout is parallel to the folding line.

4. The foldable display of claim 2, further comprising:
a scan line on the substrate and configured to transmit a scan signal; and
a data line and a driving voltage line crossing the scan line and respectively configured to transmit a data voltage and a driving voltage,
wherein the transistor comprises:
a switching transistor connected to the scan line and the data line and comprising a switching drain electrode for outputting the data voltage, and
a driving transistor comprising a driving source electrode connected to the switching drain electrode, and
wherein a driving gate electrode of the driving transistor is divided into a plurality of sub-driving gate electrodes by at least one driving gate cutout.

5. The foldable display of claim 4,
wherein a switching gate electrode of the switching transistor is divided into a plurality of sub-switching gate electrodes by at least one switching gate cutout.

6. The foldable display of claim 5,
wherein the driving gate electrode or the switching gate electrode is positioned on the folding line that is folded in the folding portion.

7. The foldable display of claim 4, further comprising:
an organic light emitting diode electrically connected to a driving drain electrode of the driving transistor.

8. A foldable display comprising:
a substrate comprising a folding portion as a portion that is folded; and
a transistor on the substrate comprising:
a gate electrode on the substrate;
a channel overlapping the gate electrode; and
a source electrode and a drain electrode positioned at respective sides of the channel,
wherein the channel is divided into a plurality of sub-channels by at least one channel cutout.

9. The foldable display of claim 8,
wherein the transistor is positioned on a folding line as a reference line that is folded in the folding portion.

10. The foldable display of claim 9,
wherein a portion of the channel cutout is parallel to the folding line.

11. The foldable display of claim 9, further comprising:
a scan line on the substrate and configured to transmit a scan signal; and
a data line and a driving voltage line crossing the scan line and respectively configured to transmit a data voltage and a driving voltage,
wherein the transistor comprises:
   a switching transistor connected to the scan line and the data line and comprising a switching drain electrode outputting the data voltage, and
   a driving transistor comprising a driving source electrode connected to the switching drain electrode, and
wherein a driving channel of the driving transistor is divided into a plurality of sub-driving channels by at least one driving channel cutout.

12. The foldable display of claim 11,
wherein a switching channel of the switching transistor is divided into a plurality of sub-switching channels by at least one switching channel cutout.

13. The foldable display of claim 12,
wherein the driving channel or the switching channel is positioned on the folding line as a reference line that is folded in the folding portion.

14. The foldable display of claim 11, further comprising:
an organic light emitting diode electrically connected to a driving drain electrode of the driving transistor.

15. The foldable display of claim 11,
wherein the driving channel is curved in a plan view.

* * * * *